(12) United States Patent
Ko et al.

(10) Patent No.: US 8,050,117 B2
(45) Date of Patent: Nov. 1, 2011

(54) COMMAND GENERATION CIRCUIT AND SEMICONDUCTOR MEMORY DEVICE

(75) Inventors: Bok Rim Ko, Seoul (KR); Keun Kook Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 431 days.

(21) Appl. No.: 12/317,943

(22) Filed: Dec. 31, 2008

(65) Prior Publication Data

US 2010/0085815 A1 Apr. 8, 2010

(30) Foreign Application Priority Data

Oct. 2, 2008 (KR) .................. 10-2008-0097387

(51) Int. Cl.
*G11C 7/00* (2006.01)
(52) U.S. Cl. .................. 365/191; 365/194
(58) Field of Classification Search ............ 365/189.05, 365/189.12, 191, 194
See application file for complete search history.

(56) References Cited

U.S. PATENT DOCUMENTS

| | | | |
|---|---|---|---|
| 5,063,526 A * | 11/1991 | Kagawa et al. ............ | 345/656 |
| 5,426,744 A * | 6/1995 | Sawase et al. ............ | 712/228 |
| 7,136,307 B2 * | 11/2006 | Piersimoni et al. ...... | 365/185.29 |
| 7,254,076 B2 | 8/2007 | Chae et al. | |
| 2010/0085816 A1 * | 4/2010 | Kim ..................... | 365/189.05 |

FOREIGN PATENT DOCUMENTS

| | | |
|---|---|---|
| KR | 10-2005-0045060 A | 5/2005 |
| KR | 10-2008-0002593 A | 1/2008 |

* cited by examiner

*Primary Examiner* — VanThu Nguyen
(74) *Attorney, Agent, or Firm* — John P. White; Cooper & Dunham LLP

(57) ABSTRACT

There is provided a command generation circuit. The command generation circuit includes a first driving unit driving an output node in response to an internal MRS command and a RAS idle signal; a second driving unit driving the output node in response to an off-signal; and a latch unit latching a signal at the output node in response to a power-up signal and generating an SRR command.

13 Claims, 5 Drawing Sheets

COMMAND GENERATION CIRCUIT AND SEMICONDUCTOR MEMORY DEVICE

TECHNICAL FIELD

The present invention relates to a semiconductor memory device, and more particularly, the present invention relates to a command generation circuit and a semiconductor memory device, wherein SRR can be normally performed.

BACKGROUND

Status information of a semiconductor memory device includes device identification (DI) information, revision identification (RI) information, refresh rate (RR) information, device width (DW) information, device type (DT) information and density (DS) information. The DI information is fixed information as information for identifying a manufacturer, and the RI information is variable information as information for defining a revision performance version. The RR information is variable information as information on refresh performance timing, and the DW information is variable information as information for defining the number of data bits outputted in accordance with an address input. The DT information is fixed information as information on capacity of the semiconductor memory device, and the DS information is fixed information on an integration degree of the semiconductor memory device.

Such status information of a semiconductor memory device is stored in a register. A user can identify the status information of the semiconductor memory device stored in the register through status register read (SRR).

The SRR is specified in JEDEC SPEC as follows: i) The SRR is started after a power-up period is ended. ii) A read command for the SRR is inputted in an idle state after application of MRS. iii) BL is fixed to 2 during SRR operation. iv) tSRR=2CLK, tSRC=CL+1. v) The SRR is ended when a bank active command is inputted. An operation timing diagram of the SRR specified in the JEDEC SPEC is shown with reference to FIG. 1.

In the JEDEC SPEC specified as described above, the conditions ii) and v) will be more specifically described. Before the read command for the SRR is inputted, the semiconductor memory device should be in an idle state. Therefore, when the bank active command is inputted before the read command for the SRR is inputted, the SRR is not normally performed but ended.

Since a general read operation of a semiconductor memory device is performed after bank activation, there have been increased requests for SRR which is, like the read operation, not ended but can be normally performed even though a read command for SRR is inputted after the bank active command for the bank active is inputted. However, in a semiconductor memory device according to the JEDEC SPEC, such requests cannot be satisfied.

SUMMARY

Embodiments of the present invention are directed to providing an SRR command generation circuit and a semiconductor memory device, wherein SRR is automatically ended, and the SRR cannot be ended but be normally performed even though a read command for the SRR is inputted after a bank active command for bank active is inputted.

In one embodiment, a command generation circuit comprises a first driving unit driving an output node in response to an internal MRS command and a RAS idle signal; a second driving unit driving the output node in response to an off-signal; and a latch unit latching a signal at the output node in response to a power-up signal and generating an SRR command.

In another embodiment, a semiconductor memory device comprises a command generation circuit receiving a plurality of control signals to generate an SRR command, the SRR command being enabled when the semiconductor memory device is in an idle state after an MRS command is enabled by the plurality of control signals, and disabled after a read operation is ended; and a pulse generating unit receiving the SRR command to generate an active pulse, the active pulse being disabled when the SRR command is enabled.

In still another embodiment, a semiconductor memory device comprises a command decoder decoding a plurality of control signals and generating an MRS command and a read command; a buffer buffering the MRS command and generating the internal MRS command; an off-signal generator receiving the read command, CAS latency signals and burst length signals, and generating the off-signal; a first driving unit driving an output node in response to an internal MRS command and a RAS idle signal; a second driving unit driving the output node in response to an off-signal; a latch unit latching a signal at the output node in response to a power-up signal and generating an SRR command; a pulse generating unit receiving the SRR command to generate an active pulse, the active pulse being disabled when the SRR command is enabled; and a multiplexer multiplexing SRR information stored in a register in response to the SRR command, and outputting the SRR information to a DQ pad.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, an exemplary embodiment of the present invention will be described with reference to accompanying drawings. The embodiment is for illustrative purposes only, and the scope of the present invention is not limited thereto.

Figure 1:
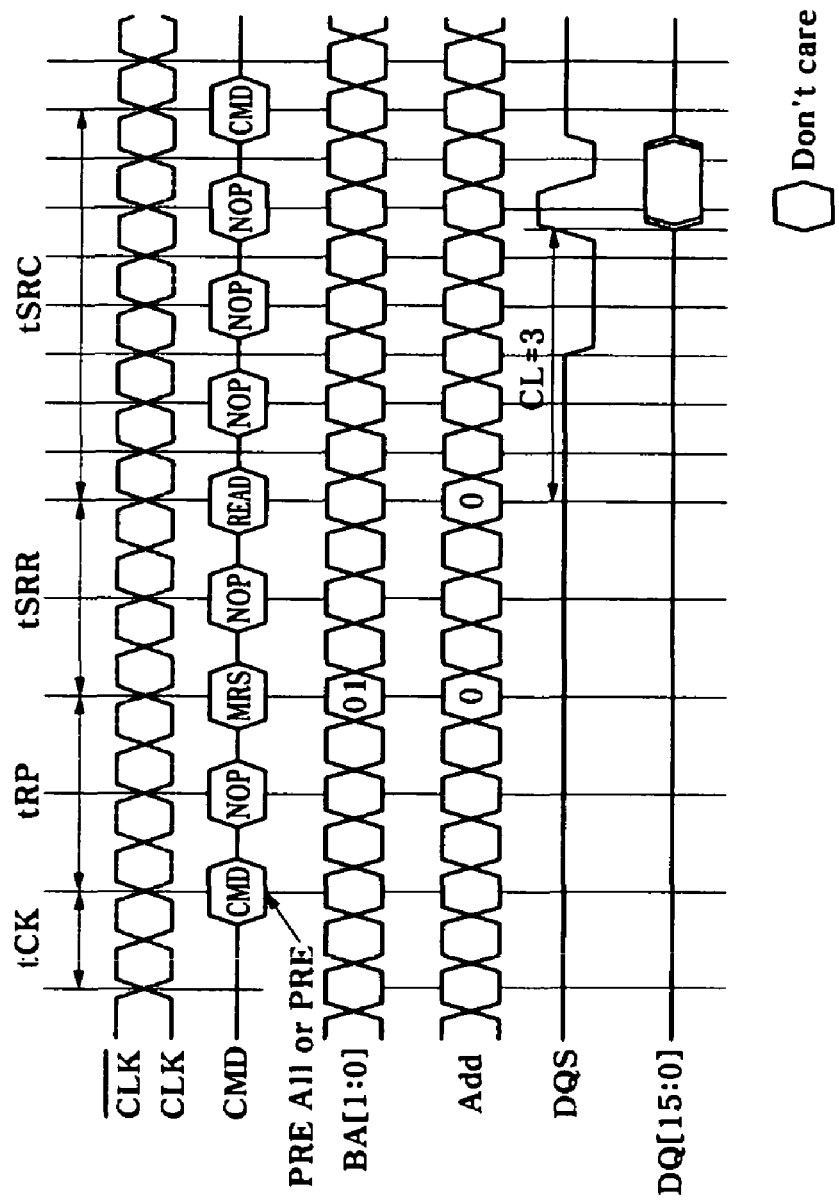
FIG. 1 is a timing diagram illustrating operations of an SRR specified by JEDEC SPEC.
Figure 2:
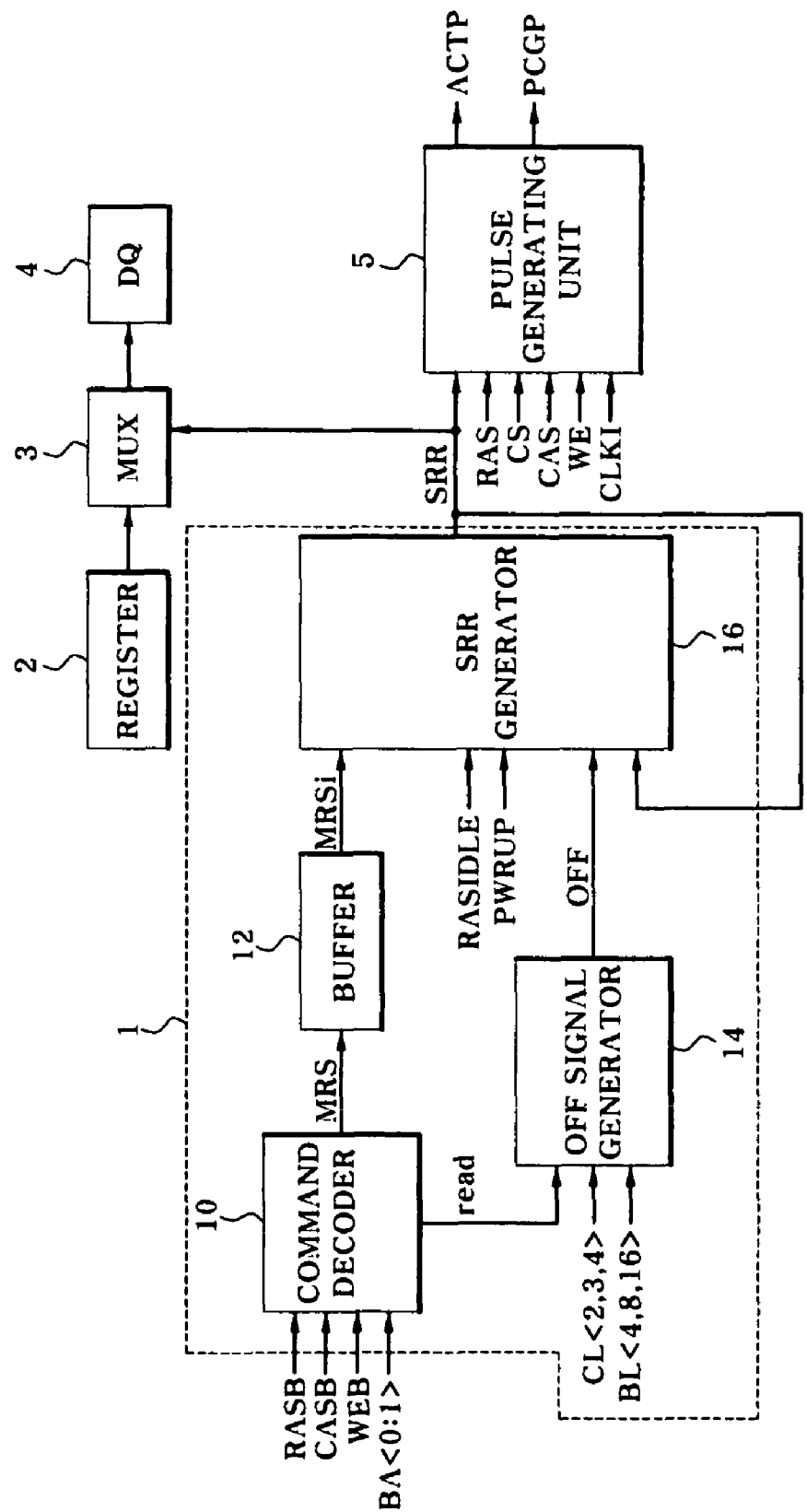
FIG. 2 is a block diagram illustrating the configuration of a semiconductor memory device according to an embodiment of the present invention.

FIG. 2 is a block diagram illustrating the configuration of a semiconductor memory device according to an embodiment of the present invention.

As illustrated in FIG. 2, the semiconductor memory device according to the embodiment of the present invention includes a command generation circuit 1, a register 2, a multiplexer 3, a DQ pad 4 and a pulse generating unit 5. The command generation circuit 1 includes a command decoder 10, a buffer 12, an off-signal generator 14 and a status register read (SRR) generator 16.

The command decoder 10 receives a plurality of control signals and generates an MRS command MRS and a read command read. The plurality of control signals includes an inversion signal RASB of a row address strobe signal, an inversion signal CASB of a column address strobe signal, an inversion signal WEB of a write enable signal, and first and second bank access signals BA<0:1>. The JEDEC SPEC specifies conditions in which the MRS command MRS and the read command read are generated. That is, when the inversion signal RASB of the row address strobe signal, the inversion signal CASB of a column address strobe signal, the inversion signal WEB of a write enable signal, and the first and second bank access signals BA<0:1> respectively have a low level, a low level, a low level, a low level and a high level, an MRS command MRS enabled to a high level is generated. When the inversion signal RASB of the row address strobe signal, the inversion signal CASB of a column address strobe signal and the inversion signal WEB of a write enable signal respectively have a high level, a low level and a high level, a read command read enabled to a high level is generated. The command decoder 10 can be implemented using a general command decoder circuit.

The buffer 12 generates an internal MRS command MRSi by buffering an MRS command MRS. The buffer 12 can be implemented using a general buffer circuit.

The off-signal generator 14 receives a read command read, CAS latency signals CL<2,3,4> and burst length signals BL<4,8,16>, and generates an off-signal which has a low level during a read operation period and is shifted to a high level when the read operation is ended. Here, the read command read includes information on an initial period of the read operation. The CAS latency signals CL<2,3,4> and the burst length signals BL<4,8,16> respectively include information on CAS Latency and information on Burst Length, which determine a read operation period. The off-signal generator 14 can be easily implemented using the fact that the read command read includes information on an initial period of the read operation, and the CAS latency signals CL<2,3,4> and the burst length signals BL<4,8,16> include information on an end period of the read operation.

Figure 3:
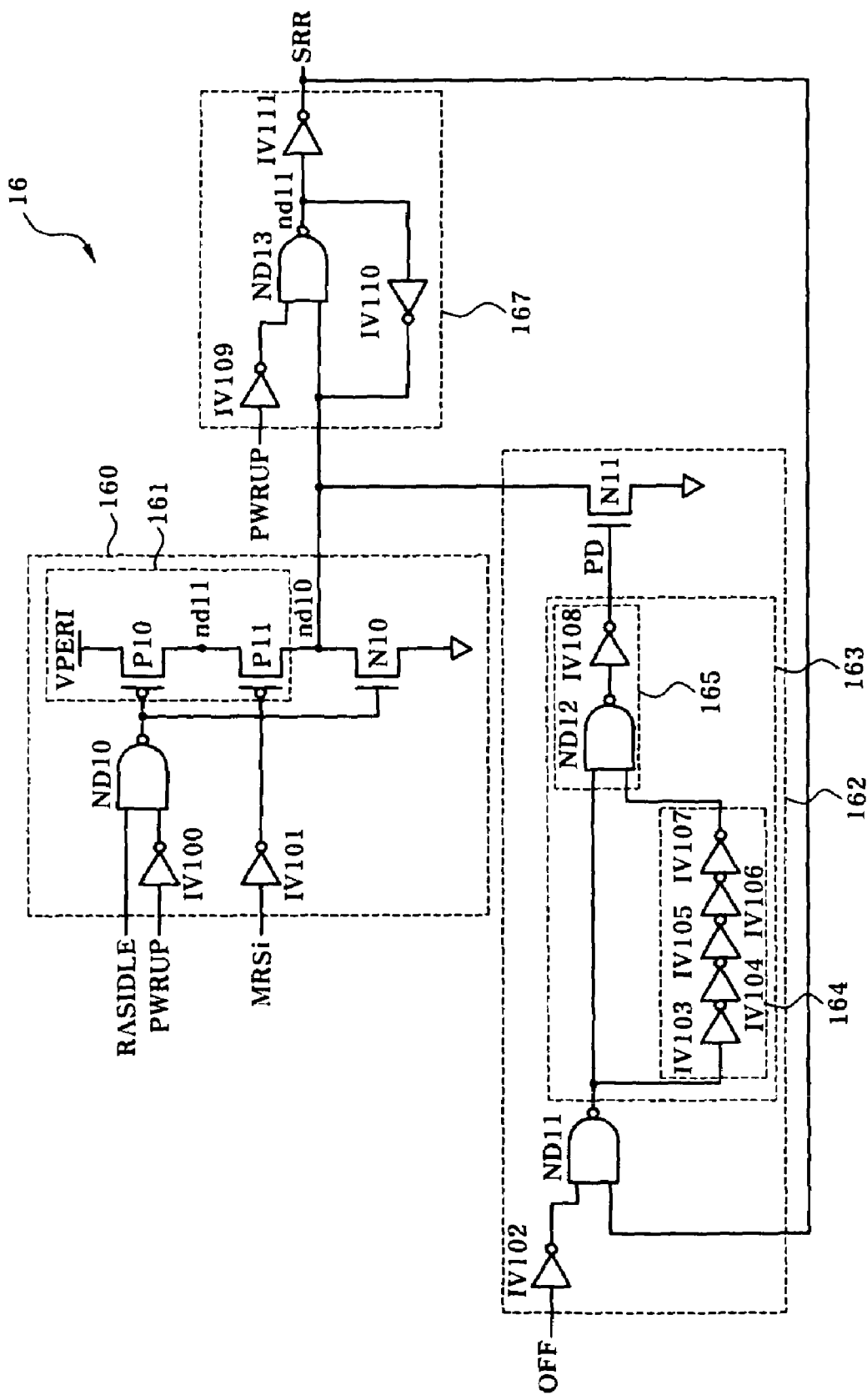
FIG. 3 is a circuit diagram of an SRR generator of the semiconductor memory device illustrated in FIG. 2.

Referring to FIG. 3, the SRR generator 16 includes a first driving unit 160, a second driving unit 162 and a latch unit 167.

The first driving unit 160 includes a NAND gate ND10, a pull-up unit 161 and an NMOS transistor N10. The NAND gate ND10 receives an inversion signal of a power-up signal PWRUP and a RAS idle signal RASIDLE, and performs a NAND operation with respect to the inversion signal of the power-up signal PWRUP and the RAS idle signal RASIDLE. The pull-up unit 161 includes PMOS transistors P10 and P11 that pull-up drive a node nd10 in response to an output signal of the NAND gate ND10 and an inversion signal of the internal MRS command MRSi. The NMOS transistor N10 pull-down drives the node nd10 in response to an output signal of the NAND gate ND10. Here, the power-up signal PWRUP is a signal which has a high level and is shifted to a low level after a power-up period is ended. The RAS idle signal RASIDLE is a signal which is shifted to a high level when the semiconductor memory device is in an idle state. The first driving unit 160 configured as described above pull-up drives the node nd10 when the semiconductor memory device is in and idle state after the internal MRS command MRSi is enabled to a high level.

The second driving unit 162 includes a NAND gate ND11, a pull-down signal generator 163 and an NMOS transistor N11. The NAND gate ND11 receives an inversion signal of an off-signal OFF and an SRR command SRR, and performs an NAND operation with respect to the inversion signal of the off-signal OFF and the SRR command SRR. The pull-down signal generator 163 includes a delay unit 164 and a logic unit 165. The delay unit 164 delays and inverts an output signal from the NAND gate ND11. The logic unit 165 receives an output signal from the NAND gate ND11 and an output signal from the delay unit 164, and performs an AND operation to generates a pull-down signal PD. The NMOS transistor N11 receives the pull-down signal PD inputted from the pull-down signal generator 163 and pull-down drives the node nd10. The second driving unit 162 configured as described above generates a high-level pull-down signal PD by the off-signal shifted to a high level when the read operation is ended, and allows the NMOS transistor N11 to be turned on, thereby pull-down driving the node nd10.

The latch unit 167 includes a NAND gate ND13, an inverter IV110 and an inverter IV111. The NAND gate ND13 operates as an inverter inverting a signal at the node nd10 in response to an inversion signal of the power-up signal PWRUP. The inverter IV110 inverts a signal at a node nd11 and outputs the inverted signal to the node nd10. The inverter IV111 inverts the signal at the node nd11 and generates an SRR command SRR. The latch unit 167 receives a power-up signal shifted to a low level after the power-up period is ended, and performs a latch operation.

SRR information is stored in the register 2. The SRR information includes device identification (DI) information, revision identification (RI) information, refresh rate (RR) information, device width (DW) information, device type (DT) information and density (DS) information. DI information is fixed information as information for identifying a manufacturer, and the RI information is variable information as information for defining a revision performance version. The RR information is variable information as information on refresh performance timing, and the DW information is variable information as information for defining the number of data bits outputted in accordance with an address input. The DT information is fixed information as information on capacity of the semiconductor memory device, and the DS information is fixed information on an integration degree of the semiconductor memory device.

When an SRR command SRR enabled to a high level is inputted to the multiplexer 3, the multiplexer 3 outputs the SRR information stored in the register 2 to the DQ pad 4.

Figure 4:
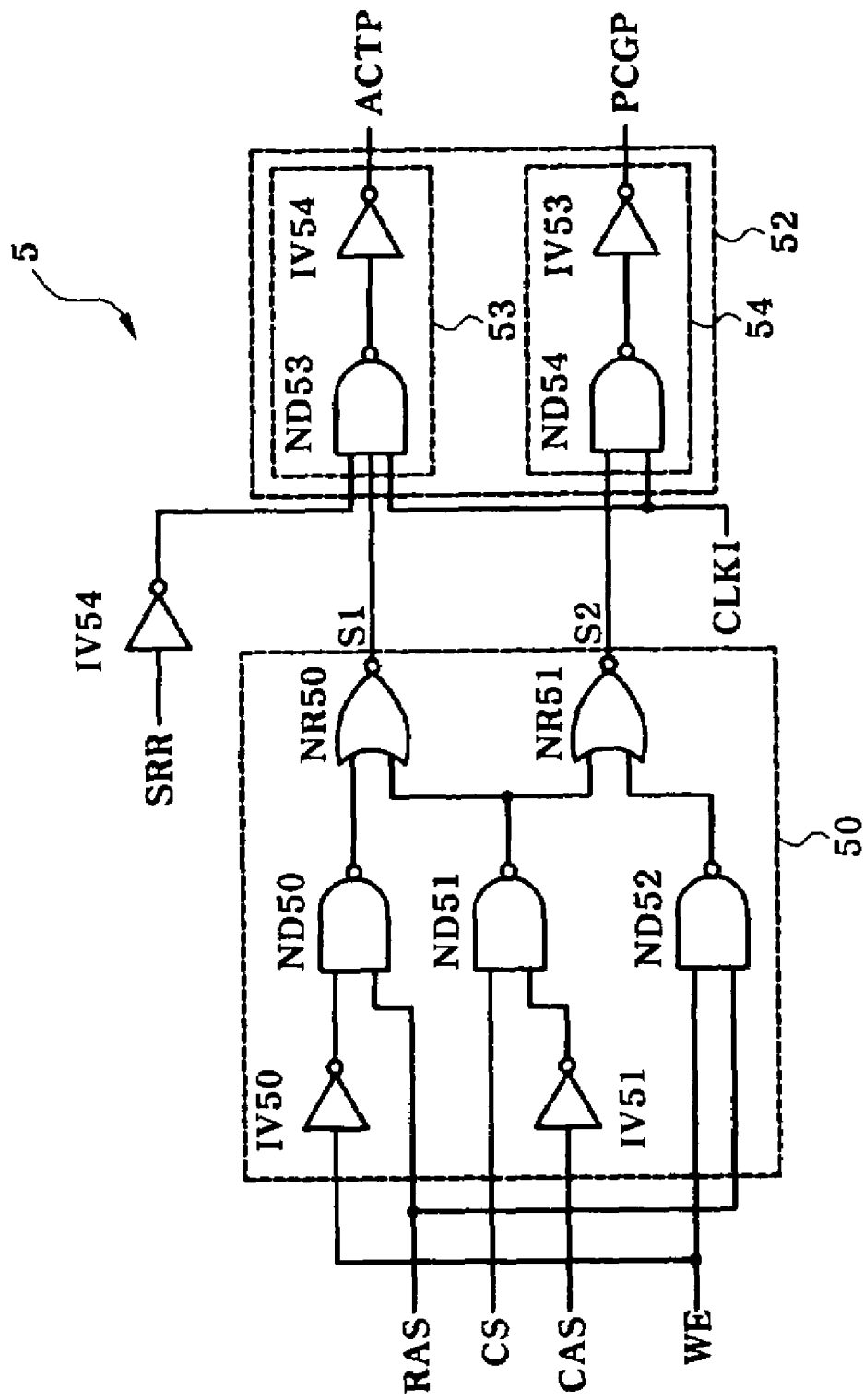
FIG. 4 is a circuit diagram of a pulse generating unit of the semiconductor memory device illustrated in FIG. 2.

Referring to FIG. 4, the pulse generating unit 5 includes a decoder 50 and a logic unit 52. When a high-level SRR command SRR is inputted to the pulse generating unit 5, the pulse generating unit 5 generates an active pulse ACTP disabled to a low level. More specifically, the decoder 50 decodes a row address strobe signal RAS, a chip select signal CS, a column address strobe signal CAS and a write enable signal WE, and generates first and second decoding signals S1 and S2. The logic unit 52 includes a logic unit 53 and a logic unit 54. The logic unit 53 receives an inversion signal of the SRR command SRR, a first decoding signal S1 and an internal clock signal CLKI, and performs an AND operation with respect to the inversion signal of the SRR command SRR, the first decoding signal S1 and the internal clock signal CLKI, thereby generating an active pulse ACTP. The logic unit 54 receives a second decoding signal S2 and an internal clock signal CLKI, and performs an AND operation with respect to the second decoding signal S2 and the internal clock signal CLKI, thereby generating a pre-charge pulse PCGP.

Hereinafter, an SRR operation of the semiconductor memory device according to the embodiment of the present invention, configured as described above, will be described with reference to FIG. 5.

Figure 5:
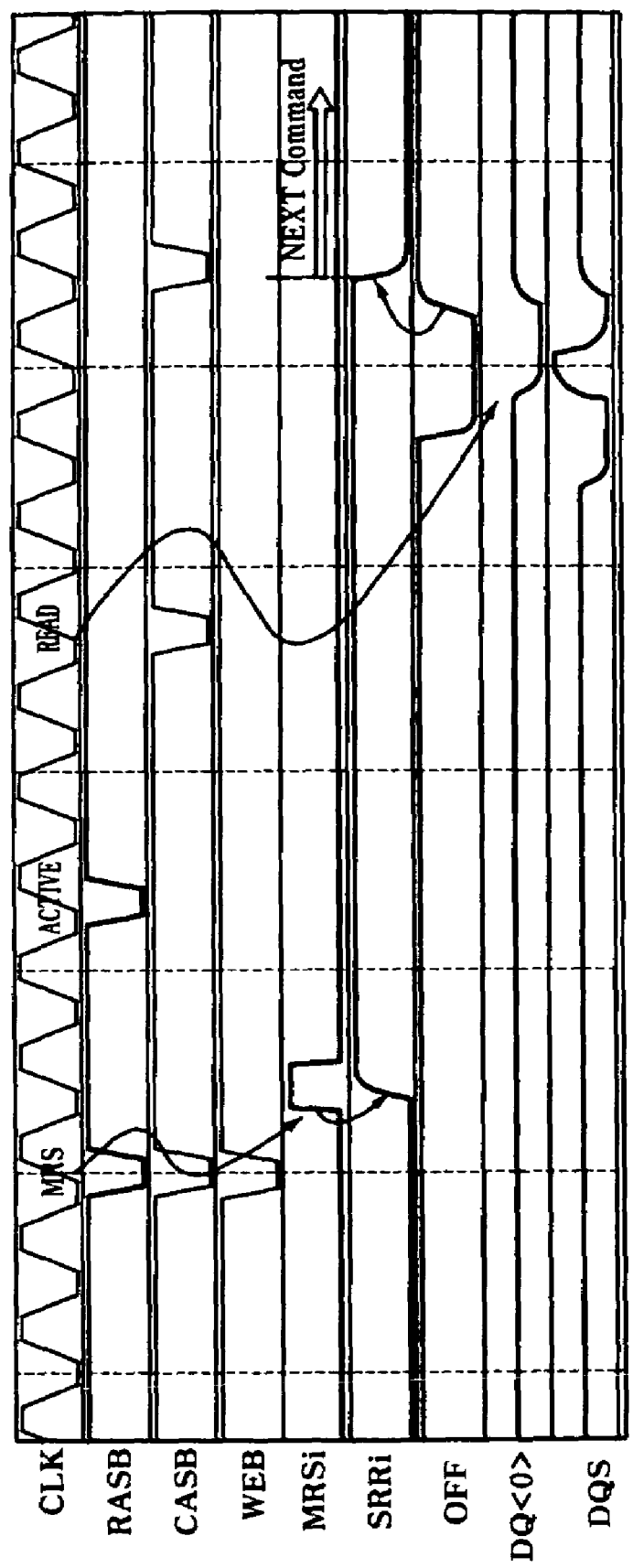
FIG. 5 is a timing diagram illustrating operations of the semiconductor memory device illustrated in FIG. 2.

Referring to FIG. 5, when an inversion signal RASB of a row address strobe signal, an inversion signal CASB of a column address strobe signal, an inversion signal WEB of a write enable signal, and first and second bank access signals BA<0:1> respectively have a low level, a low level, a low level, a low level and a high level, the command decoder 10 generates an MRS command MRS enabled to a high level. The buffer 12 generates an internal MRS command MRSi by buffering the MRS command MRS.

The SRR generator 16 receives the internal MRS command MRSi inputted from the buffer 12 and generates an SRR command SRR enabled to a high level. More specifically, when the semiconductor memory device is in an idle state in the period at which an internal MRS command MRSi is inputted, a RAS idle signal RASIDLE has a high level. Here, the internal MRS command MRSi is a pulse signal enabled to a high level. A power-up signal PWRUP is shifted to a low level after a power-up period is ended. Therefore, the PMOS transistors P10 and P11 of the pull-up unit 161 are all turned on, and the node nd10 is pull-up driven to a high level. Accordingly, the SRR command SRR outputted through the latch unit 167 is enabled to a high level.

The logic unit 53 receives the high-level SRR command SRR inputted from the latch unit 167 and disables an active pulse ACTP to a low level. That is, when the SRR command SRR is enabled to a high level, the active pulse ACTP is maintained to be in a state disabled to a low level.

Thereafter, although a bank active command is inputted (when an inversion signal RASB of a row address strobe signal, an inversion signal CASB of a column address strobe signal, an inversion signal WEB of a write enable signal and a chip select signal CS respectively have a low level, a high level, a high level and a low level), the active pulse ACTP is maintained to be in a state disabled to a low level. This is because, in the semiconductor memory device according to the embodiment of the present invention, the active pulse ACTP is maintained to be in a low-level state by the pulse generating unit 5 when the SRR command SRR is enabled to a high level.

Subsequently, when a read command is inputted (when an inversion signal RASB of a row address strobe signal, an inversion signal CASB of a column address strobe signal and an inversion signal WEB of a write enable signal respectively have a high level, a low level and a high level), the command decoder 10 generates an enabled read command read.

The off-signal generator 14 receives a read command read, CAS latency signals CL<2,3,4> and burst length signals BL<4,8,16>, and generates an off-signal OFF which has a low level during a read operation period and is shifted to a high level when a read operation is ended.

The SRR information stored in the register 2 during the read operation period is outputted to the DQ pad 4 via the multiplexer 3 performing a multiplexing operation in response to an SRR command SRR.

When the read operation is ended, the off-signal OFF is shifted to a high level. Therefore, the second driving unit 162 illustrated in FIG. 3 disables the SRR command SRR to a low level by pull-down driving the node nd10.

As described above, in the semiconductor memory device according to the embodiment of the present invention, although a read command for SRR is inputted after a bank active command for bank active is inputted, the SRR is not ended but normally performed, like a general read operation. That is, although the bank active command is inputted, it is possible to prevent an active pulse ACTP from being enabled using an SRR command, so that the SRR is not ended. Further, the SRR can be automatically ended by an off-signal OFF internally generated regardless of the bank active command.

While the present invention has been described with respect to the particular embodiments, it will be apparent to those skilled in the art that various changes and modifications may be made without departing from the spirit and scope of the invention as defined in the following claims.

The present disclosure claims priority to Korean application number 10-2008-0097387, filed on Oct. 2, 2008, the entire contents of which are incorporated herein by reference.

What is claimed is:

1. A command generation circuit comprising:
   a first driving unit driving an output node in response to an internal MRS command and a RAS idle signal;
   a second driving unit driving the output node in response to an off-signal; and
   a latch unit latching a signal at the output node in response to a power-up signal and generating an SRR command.

2. The command generation circuit of claim 1, wherein the first driving unit pull-up drives the output node when a semiconductor memory device is in an idle state after the internal MRS command is enabled.

3. The command generation circuit of claim 1, wherein the first driving unit comprises:
   a logic device receiving the power-up signal and the RAS idle signal and performing a logic operation with respect to the power-up signal and the RAS idle signal;
   a pull-up unit pull-up driving the output node in response to an output signal from the logic device and the internal MRS command; and
   a pull-down device pull-down driving the output node in response to the output signal from the logic device.

4. The command generation circuit of claim 1, wherein the second driving unit pull-down drives the output node after a read operation is ended.

5. The command generation circuit of claim 1, wherein the second driving unit comprises:
   a logic device receiving the off-signal and the SRR command to perform a logic operation with respect to the off-signal and the SRR command;
   a delay unit delaying an output signal from the logic device during a predetermined period;
   a logic unit receiving output signals from the logic device and the delay unit and performing a logic operation with respect to the output signals; and
   a pull-down device pull-down driving the output node in response to the output signal from the logic unit.

6. The command generation circuit of claim 1, wherein the latch unit latches a signal at the output node after a power-up period is ended.

7. The command generation circuit of claim 1, further comprising:
   a command decoder decoding a plurality of control signals and generating an MRS command and a read command;
   a buffer buffering the MRS command and generating the internal MRS command; and
   an off-signal generator receiving the read command, CAS latency signals and burst length signals, and generating the off-signal.

8. The command generation circuit of claim 7, wherein the off-signal generator generates the off-signal enabled after a read operation period is ended.

9. A semiconductor memory device comprising:
a command decoder decoding a plurality of control signals and generating an MRS command and a read command;
a buffer buffering the MRS command and generating the internal MRS command;
an off-signal generator receiving the read command, CAS latency signals and burst length signals, and generating the off-signal;
a first driving unit driving an output node in response to an internal MRS command and a RAS idle signal;
a second driving unit driving the output node in response to an off-signal;
a latch unit latching a signal at the output node in response to a power-up signal and generating an SRR command;
a pulse generating unit receiving the SRR command to generate an active pulse, the active pulse being disabled when the SRR command is enabled; and
a multiplexer multiplexing SRR information stored in a register in response to the SRR command, and outputting the SRR information to a DQ pad.

10. The semiconductor memory device of claim 9, wherein the off-signal generator generates the off-signal enabled after a read operation period is ended.

11. The semiconductor memory device of claim 9, wherein the first driving unit pull-up drives the output node when a semiconductor memory device is in an idle state after the internal MRS command is enabled.

12. The semiconductor memory device of claim 9, wherein the second driving unit pull-down drives the output node after a read operation is ended.

13. The semiconductor memory device of claim 9, wherein the pulse generating unit comprises:
    a decoder decoding the plurality of control signals and generating a decoding signal; and
    a logic unit receiving an output of the decoder, an SRR command and an internal clock, and generating the active pulse.

* * * * *